US012681394B2

(12) United States Patent
Funabashi et al.

(10) Patent No.: US 12,681,394 B2
(45) Date of Patent: Jul. 14, 2026

(54) TEMPERATURE ADJUSTMENT APPARATUS, LITHOGRAPHY APPARATUS, AND ARTICLE MANUFACTURING METHOD

(71) Applicant: CANON KABUSHIKI KAISHA, Tokyo (JP)

(72) Inventors: Naoki Funabashi, Tochigi (JP); Mizuki Narimatsu, Tochigi (JP); Tsutomu Takenaka, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 34 days.

(21) Appl. No.: 18/633,359

(22) Filed: Apr. 11, 2024

(65) Prior Publication Data

US 2024/0345494 A1      Oct. 17, 2024

(30) Foreign Application Priority Data

Apr. 17, 2023      (JP) ................................. 2023-067180

(51) Int. Cl.
*G03F 7/00* (2006.01)

(52) U.S. Cl.
CPC ...... *G03F 7/70891* (2013.01); *G03F 7/70525* (2013.01); *G03F 7/70775* (2013.01); *G03F 7/70808* (2013.01); *G03F 7/7085* (2013.01)

(58) Field of Classification Search
CPC ............. G03F 7/70933; G03F 7/70891; G03F 7/70875; G03F 7/7085; G03F 7/70916; G03F 7/70925; G03F 7/70866; G03F 7/70525; G03F 7/70716; G03F 7/70883
See application file for complete search history.

(56) References Cited

U.S. PATENT DOCUMENTS

| | | | |
|---|---|---|---|
| 5,550,633 A | 8/1996 | Kamiya | |
| 6,126,082 A * | 10/2000 | Doyle | F28F 9/22 237/12.3 B |
| 6,226,073 B1 * | 5/2001 | Emoto | H02K 3/24 378/34 |
| 9,751,146 B2 * | 9/2017 | Kagaya | B23K 1/0016 |

(Continued)

FOREIGN PATENT DOCUMENTS

| | | |
|---|---|---|
| EP | 0838728 A2 | 4/1998 |
| JP | 2002324750 A | 11/2002 |

(Continued)

OTHER PUBLICATIONS

Machine translation of JP-4434518-B2 (Year: 2010).*

*Primary Examiner* — Steven H Whitesell
(74) *Attorney, Agent, or Firm* — Canon U.S.A., Inc. IP Division

(57) ABSTRACT

A temperature adjustment apparatus includes a blowing unit configured to blow a temperature-adjusted gas to an optical path of an optical system via an opening portion, wherein a shape of an outer periphery of the opening portion includes a depressed portion depressed inward from a circumscribed circle of the opening portion, wherein in a case where a position nearest to a center of the circumscribed circle in the depressed portion is any of an intersection point of two straight line portions, an intersection point of two curved line portions, and an intersection point of a straight line portion and a curved line portion, an angle at the intersection point inside the opening portion is 180 degrees or more.

15 Claims, 12 Drawing Sheets

(56)          References Cited

U.S. PATENT DOCUMENTS

| | | | |
|---|---|---|---|
| 2007/0046911 | A1 | 3/2007 | Aichi |
| 2012/0178039 | A1 | 7/2012 | Kagaya |
| 2015/0070680 | A1* | 3/2015 | Nakano .............. G01B 9/02021 |
| | | | 355/72 |
| 2021/0399532 | A1* | 12/2021 | Ban ........................ H01T 13/54 |

FOREIGN PATENT DOCUMENTS

| | | | |
|---|---|---|---|
| JP | 2002373849 A | | 12/2002 |
| JP | 4434518 B2 | * | 3/2010 |
| JP | 2022175879 A | | 11/2022 |

* cited by examiner

FIG.7A
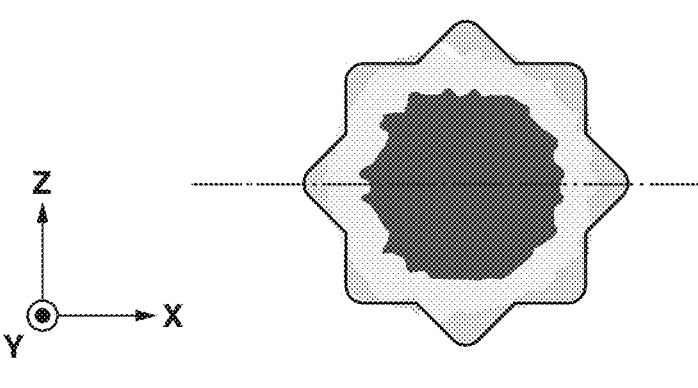
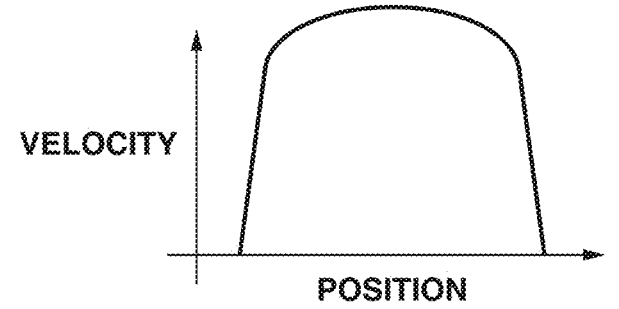
FIG.7B
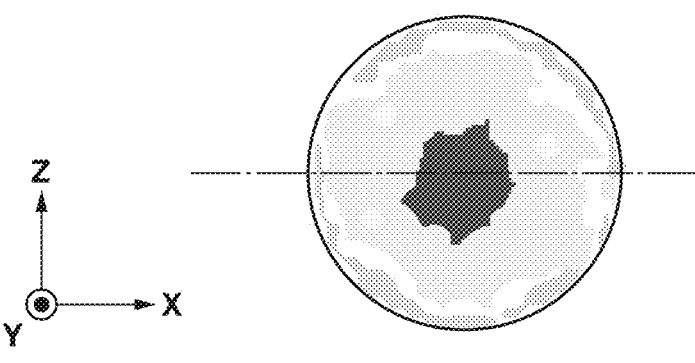
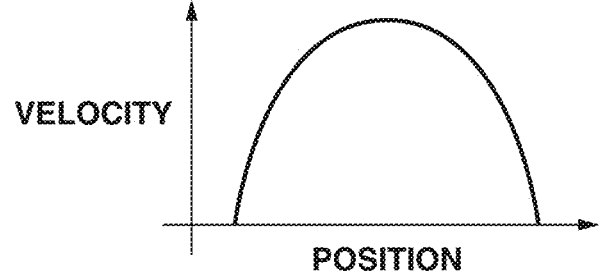

FIG.8A
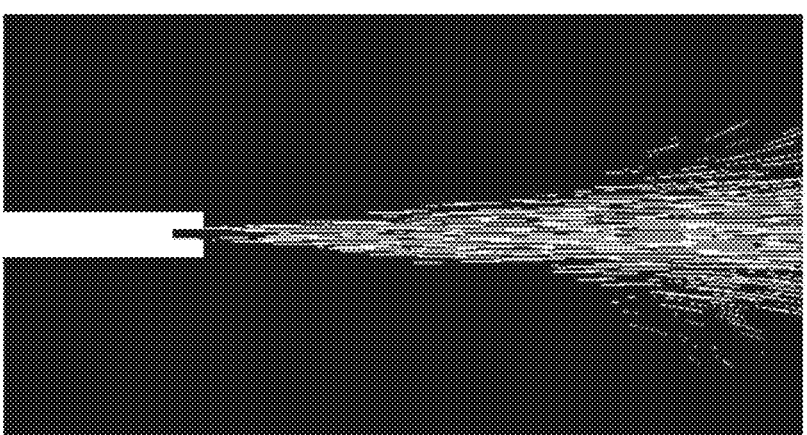
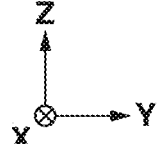
FIG.8B
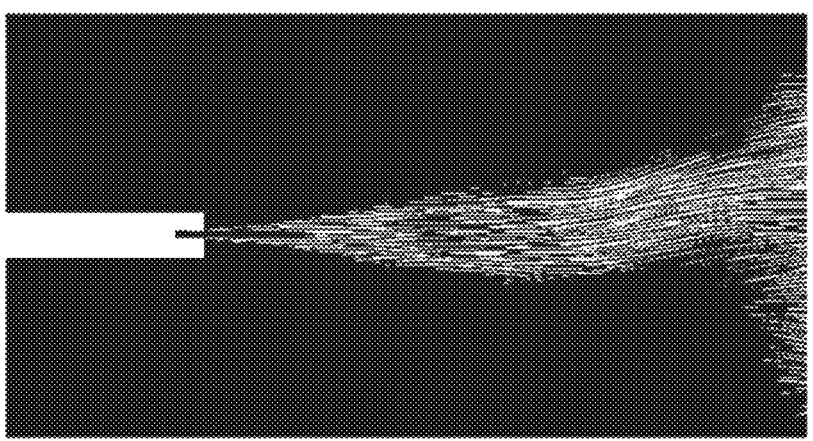
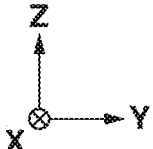

TEMPERATURE ADJUSTMENT APPARATUS, LITHOGRAPHY APPARATUS, AND ARTICLE MANUFACTURING METHOD

BACKGROUND OF THE INVENTION

Field of the Invention

The present invention relates to a temperature adjustment apparatus, a lithography apparatus, and an article manufacturing method.

Description of the Related Art

In a manufacturing process of semiconductor devices or liquid crystal display devices, an optical system such as an illumination optical system, a projection optical system, and/or a measurement optical system may be used. When a temperature change occurs in an optical path of the optical system, the performance of the optical system may deteriorate due to the influence of the temperature change.

Japanese Patent Application Laid-open No. 2022-175879 discusses a method of reducing a temperature change in the periphery of an optical path of a measurement optical system (measurement unit), by blowing gas from a blowing unit toward the periphery of the optical path of the measurement optical system.

At this time, in a case where a temperature-adjusted gas is blown to the optical path to reduce the temperature change in the optical path of the optical system, the blown gas may spread to a direction orthogonal to the gas blowing direction.

In this way, the gas is blown to an optical element in the optical system, and the optical element is locally changed in temperature, to deteriorate the optical performance.

SUMMARY OF THE INVENTION

The present invention is directed to a temperature adjustment apparatus capable of adjusting a temperature of an optical path while reducing a local temperature change of an optical element in an optical system.

According to an aspect of the present invention, a temperature adjustment apparatus includes a blowing unit configured to blow a temperature-adjusted gas to an optical path of an optical system via an opening portion, wherein a shape of an outer periphery of the opening portion includes a depressed portion depressed inward from a circumscribed circle of the opening portion, wherein in a case where a position nearest to a center of the circumscribed circle in the depressed portion is any of an intersection point of two straight line portions, an intersection point of two curved line portions, and an intersection point of a straight line portion and a curved line portion, an angle at the intersection point inside the opening portion is 180 degrees or more, wherein in a case where the position nearest to the center of the circumscribed circle in the depressed portion is a curved line portion, a diameter of the curved line portion is two thirds or less of a diameter of the circumscribed circle, and wherein in a case where the position nearest to the center of the circumscribed circle in the depressed portion is a straight line portion, a length of the straight line portion is one fifth or less of the diameter of the circumscribed circle.

Further features of the present invention will become apparent from the following description of embodiments with reference to the attached drawings.

BRIEF DESCRIPTION OF THE DRAWINGS

FIGS. 7A and 7B are diagrams each illustrating a simulation result of a gas flow speed (velocity) in the opening portion when the gas is blown.

FIGS. 8A and 8B are diagrams each illustrating a flowing state of the gas blown from the blowing unit via the opening portions.

DESCRIPTION OF THE EMBODIMENTS

Hereinbelow, embodiments of the present invention will be described with reference to the attached drawings. Note that the embodiments described below are not intended to limit the present invention related to the range of the claims. In the embodiments, a plurality of features is described, but not all the features are necessarily essential, and the plurality of features may be arbitrarily combined. Further, in the attached drawings, the same or similar components are assigned the same reference numbers, and the redundant descriptions thereof are omitted. Each of the embodiments of the present invention described below can be implemented solely or as a combination of a plurality of the embodiments or features thereof where necessary or where the combination of elements or features from individual embodiments in a single embodiment is beneficial.

Further, in the present specification and the drawings, basically, directions are expressed using an XYZ coordinate system in which the vertical direction is set as a Z axis, a horizontal plane perpendicular to the vertical direction is set as an XY plane, and X, Y, and Z axes are orthogonal with each other. However, in a case where an XYZ coordinate system is drawn in a drawing, the XYZ coordinate system has priority.

Hereinbelow, a specific configuration of each of the embodiments will be described.

Figure 1:
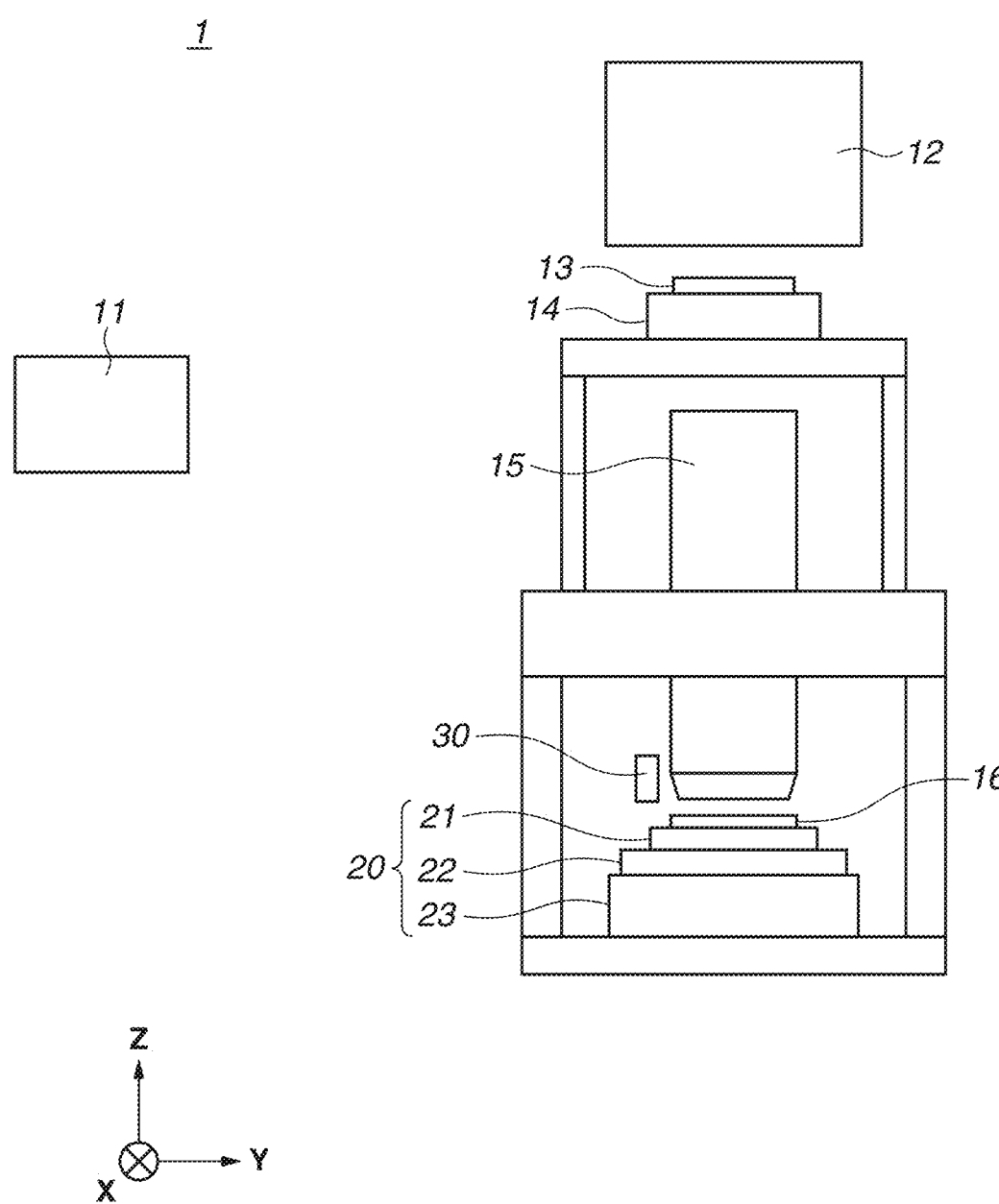
FIG. 1 is a schematic diagram illustrating a configuration of a substrate processing apparatus according to a first embodiment.

FIG. 1 is a schematic diagram illustrating a configuration of a substrate processing apparatus 1 according to a first embodiment. In the present embodiment, the substrate processing apparatus 1 is a projection exposure apparatus configured to project a pattern of an original (i.e., mask or reticle) onto a substrate via a projection optical system, using a step-and-repeat method or a step-and-scan method. However, the substrate processing apparatus 1 is not limited to the projection exposure apparatus. For example, the substrate processing apparatus 1 may be a drawing apparatus configured to perform drawing on a substrate using an electron beam or an ion beam, to form a pattern on the substrate. Further, the substrate processing apparatus 1 may be another lithography apparatus (substrate exposure apparatus), for example, an imprint apparatus configured to shape an imprint material on a substrate with a mold, to form a pattern on the substrate. Alternatively, the substrate processing apparatus 1 may be another apparatus configured to process a substrate such as a semiconductor wafer or a glass plate, for example, an ion implantation apparatus, a development apparatus, an etching apparatus, a film deposition apparatus, an anneal apparatus, a sputtering apparatus, and a vapor deposition apparatus. Further, the substrate processing apparatus 1 may be a planarization apparatus configured to flatten a composition on a substrate using a flat plate.

The substrate processing apparatus 1 includes an illumination optical system 12 configured to emit light, a projection optical system 15, a reticle stage 14 configured to hold a reticle 13, a stage 20 movable while holding a substrate 16, an off-axis scope (OAS) 30, and a first control unit 11.

The stage 20 includes an XY stage 23 movable in the XY plane, a fine movement stage 22 disposed on the XY stage 23 and finely movable, and a substrate chuck 21 configured to hold the substrate 16 in a state of being held by the fine movement stage 22. The fine movement stage 22 can be moved (driven) in the X axis direction, the Y axis direction, the Z axis direction (optical axis direction of the projection optical system 15), a θx axis direction, a θy axis direction, and a θz axis direction. In other words, the fine movement stage 22 can be moved (driven) in six directions. In the present embodiment, the θx axis direction is a rotation direction about the X axis, the θy axis direction is a rotation direction about the Y axis, and the θz axis direction is a rotation direction about the Z axis. Further, a position in the θx axis direction refers to a rotation angle about the X axis, a position in the θy axis direction refers to a rotation angle about the Y axis, and a position in the θz axis direction refers to a rotation angle about the Z axis.

The reticle 13 is an original on which a pattern (e.g., circuit pattern) to be transferred to a surface of, for example, a quartz glass is formed with chromium. Further, for example, in a case where the substrate 16 is a single crystal silicon substrate and the substrate processing apparatus 1 is an exposure apparatus, a photosensitive material (resist) is applied on a surface of the substrate 16 conveyed to the substrate processing apparatus 1. Here, the illumination optical system 12 is a pattern formation unit configured to form a pattern on the substrate 16. In addition, in the present embodiment, an example in which a lithography apparatus forms a pattern using light, and the pattern formation unit is the illumination optical system 12 is described, but a lithography apparatus that cures a thermosetting material with heat may be used. In this case, the pattern formation unit is, for example, a heating unit configured to heat the thermosetting material. The first control unit 11 controls each component in the substrate processing apparatus 1.

The off-axis scope 30 is used to determine a position of the substrate 16 and to detect positions of a plurality of pattern areas on the substrate 16, and the off-axis scope 30 detects a relative position and an attitude relationship between an alignment mark (not illustrated) formed on the substrate 16 and a reference mark (not illustrated) on the fine movement stage 22. The substrate processing apparatus 1 performs positioning of the stage 20 (substrate 16) based on a measurement result of the off-axis scope 30 and a measurement result obtained using laser interferometers and bar mirrors described below.

In the substrate processing apparatus 1, exposure light from a light source (not illustrated) illuminates the reticle 13 held by the reticle stage 14, via the illumination optical system 12. The light that has passed through the reticle 13 is emitted onto the substrate 16 via the projection optical system 15. At this time, the light from the pattern formed on the reticle 13 is focused on the surface of the substrate 16. The substrate processing apparatus 1 exposes a shot region on the substrate 16 to light in this way, and exposes each of a plurality of shot regions to light in a similar manner.

Figure 2:
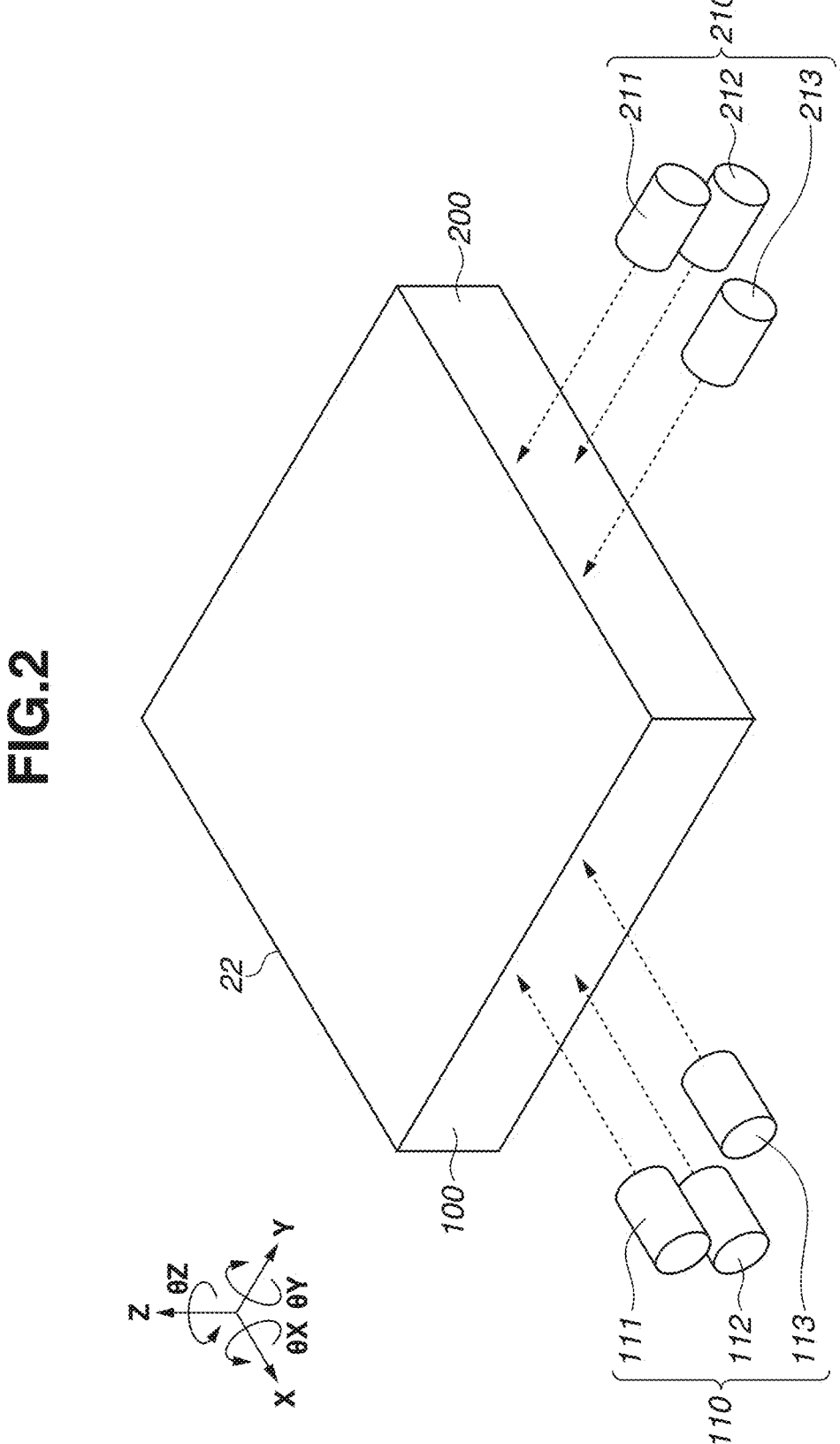
FIG. 2 is a schematic diagram illustrating a method of measuring a position of a fine movement stage using laser interferometers.

FIG. 2 is a schematic diagram illustrating a method of measuring a position of the fine movement stage 22 using laser interferometers. A position of the fine movement stage 22 in the X axis direction is measured using an X-bar mirror 100 and a laser interferometer 110. A position of the fine movement stage 22 in the Y axis direction is measured using a Y-bar mirror 200 and a laser interferometer 210. The X-bar mirror 100 is provided to extend in the Y axis direction on a side surface of the fine movement stage 22, and the Y-bar mirror 200 is provided to extend in the X axis direction on a side surface of the fine movement stage 22.

First, a method of measuring the position of the fine movement stage 22 in the X axis direction will be described. The laser interferometer 110 includes three laser interferometers 111, 112, and 113. The laser interferometer 112 is disposed at a same position in the horizontal direction (i.e., same position on the X axis, and same position on the Y axis) as the laser interferometer 111 and separate from the laser interferometer 111 by an interval Δz in the height direction (i.e., Z axis direction). Based on the measurement results of the laser interferometer 111 and the laser interferometer 112, a shift amount Oy in the rotation direction about the Y axis can be measured. The laser interferometer 113 is disposed at a same position in height (i.e., same position in the Z axis direction) as the laser interferometer 111 and separate from the laser interferometer 111 by an interval Δy in the horizontal direction (i.e., Y axis direction). Based on the measurement results of the laser interferometer 111 and the laser interferometer 113, a shift amount θz in the rotation direction about the Z axis in the XY plane can be measured.

Next, a method of measuring a position of the fine movement stage 22 in the Y axis direction will be described. The laser interferometer 210 includes three laser interferometers 211, 212, and 213. The laser interferometer 212 is disposed at a same position in the horizontal direction (i.e., same position on the X axis, and same position on the Y axis) as the laser interferometer 211 and separate from the laser interferometer 211 by an interval Δz in the height direction (i.e., Z axis direction). Based on the measurement results of the laser interferometer 211 and the laser interferometer 212, a shift amount θx in the rotation direction around the X axis can be measured. The laser interferometer 213 is disposed at a position the same in the height direction (i.e., same position in Z axis direction) as the laser interferometer 211, and separate from the laser interferometer 211 by an interval Δx in the horizontal direction (i.e., X axis direction). Based on the measurement results of the laser interferometer 211 and the laser interferometer 213, a shift amount Oz in the rotation direction about the Z axis in the XY plane can be measured. With the configuration described above, the position of the fine movement stage 22 is measured. In the present embodiment, the bar mirrors 100 and 200 are arranged on the sides of the fine movement stage 22, but the arranged positions are not limited thereto, and the bar mirrors 100 and 200 may be arranged on the upper surface of the fine movement stage 22. In addition, the off-axis scope 30, and the laser interferometers 110 and 210 each are a measurement optical system.

In the present embodiment, a temperature change may occur in the optical path of the optical system such as the off-axis scope 30, the laser interferometer 110, the laser interferometer 210, the projection optical system 15, and the illumination optical system 12. The temperature change occurs due to, for example, heat generated at a time of processing a substrate (e.g., exposure heat generated at a time of exposure), driving heat generated when the stage 20 is driven, and heat from a driving unit or an encoder provided on the measurement optical system. When such a temperature change occurs, the performance of the optical system may deteriorate due to the influence of the temperature change. In a case where a temperature-adjusted gas is blown to the optical path to reduce the temperature change in the optical path, the blown gas may spread to a direction orthogonal to the blown direction. In this case, the gas is blown to an optical element in the optical system, and the optical element locally changes in temperature, to cause the optical performance to deteriorate. Further, when the gas is blown to the optical element in the optical system or the substrate 16, the object to which the gas has been blown may vibrate to cause the optical performance or the measurement accuracy to deteriorate. The temperature adjustment apparatus according to the present embodiment can adjust the temperature of the optical path while reducing the local temperature change of the optical element in the optical system or the vibrations of the object caused by the gas blown thereto. The optical path in the optical system according to the present embodiment is an optical path through which one or more light beams pass.

Figure 3:
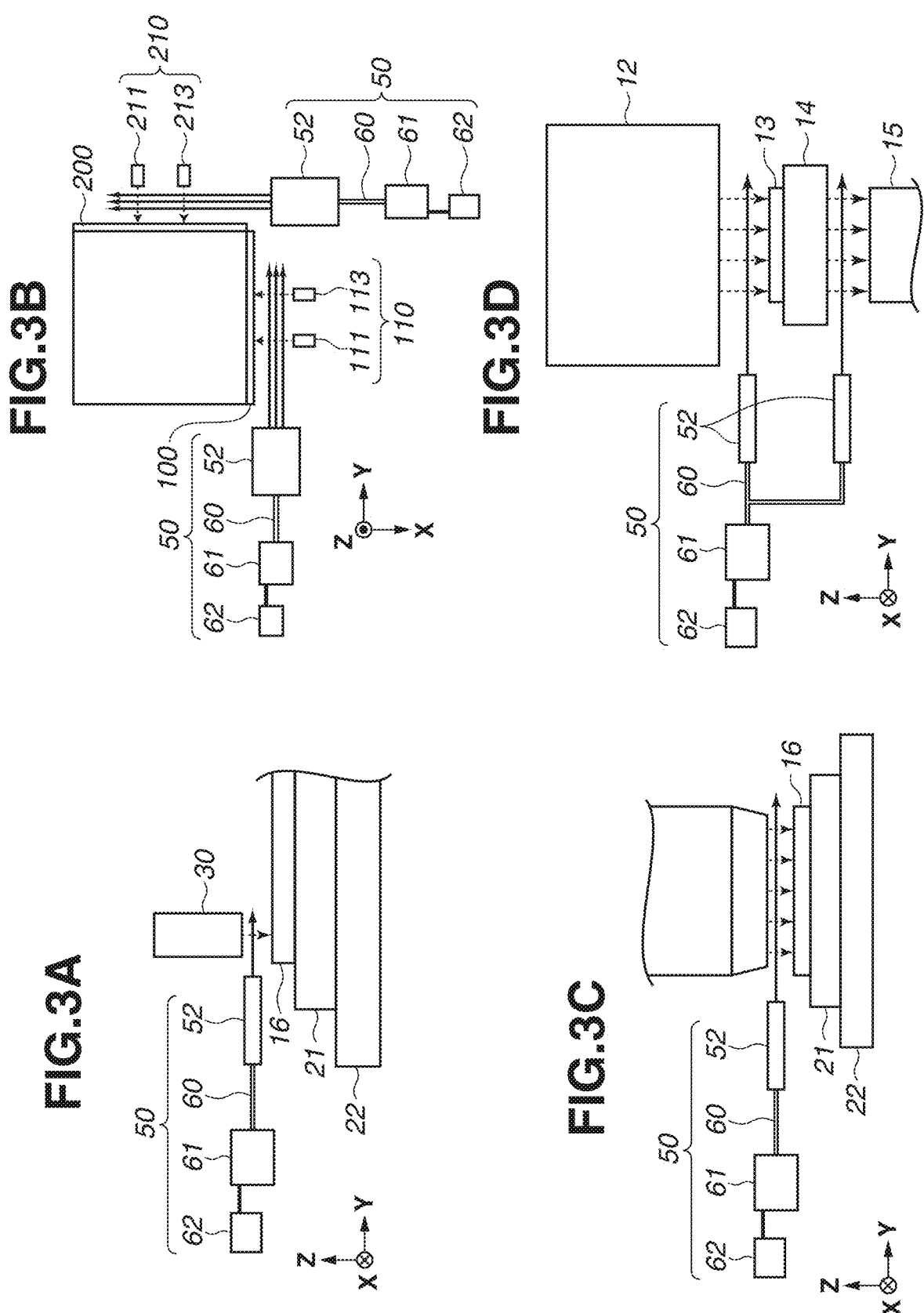
FIGS. 3A to 3D are diagrams each illustrating an arrangement example of a temperature adjustment apparatus according to the first embodiment.

FIGS. 3A to 3D are examples each illustrating an arrangement of the temperature adjustment apparatus according to the present embodiment. FIG. 3A illustrates a temperature adjustment apparatus 50 configured to blow a temperature-adjusted gas to the optical path of the off-axis scope 30, to reduce the temperature change in the optical path of the off-axis scope 30. The temperature adjustment apparatus 50 includes a temperature adjustment unit 61 configured to perform a gas temperature adjustment, a blowing unit 52 configured to blow gas through an opening portion (hole) or opening portions, a pipe 60, which is a gas flow path connecting the blowing unit 52 and the temperature adjustment unit 61, and a second control unit 62 configured to control the temperature adjustment apparatus 50. The opening portions are holes provided in the blowing unit 52. Alternatively, the first control unit 11 configured to control the substrate processing apparatus 1 may also control the temperature adjustment apparatus 50.

When the temperature in the optical path of the off-axis scope 30 changes, errors may occur in the measurement result. The temperature adjustment apparatus 50 according to the present embodiment blows the temperature-adjusted gas to the optical path. For example, the off-axis scope 30 may perform the measurement after the temperature in the optical path has become a desired temperature, not performing the measurement using the off-axis scope 30 until a value of a sensor that can measure the temperature in the optical path of the off-axis scope 30 reaches the desired temperature. In this way, it is possible to reduce the errors in the measurement result of the off-axis scope 30. The gas temperature adjustment is performed by the temperature adjustment unit 61, and the gas temperature-adjusted by the temperature adjustment unit 61 is supplied to the blowing unit 52 via the pipe 60. FIG. 3B illustrates the temperature adjustment apparatuses 50 respectively configured to blow temperature-adjusted gases to the optical paths of the laser interferometer 110 and the laser interferometer 210, to reduce the temperature changes in the optical paths of the laser interferometer 110 and the laser interferometer 210. FIG. 3C illustrates the temperature adjustment apparatus 50 configured to blow a temperature-adjusted gas to the optical path of the projection optical system 15, to reduce the temperature change in the optical path of the projection optical system 15. FIG. 3D illustrates the temperature adjustment apparatus 50 configured to blow temperature-adjusted gases to the optical path of the illumination optical system 12, to reduce the temperature change in the optical path of the illumination optical system 12. In FIG. 3D, the temperature adjustment apparatus 50 blows the gases to an upper side region (+Z side region) of the reticle 13, and a lower side region (−Z side region) of the reticle stage 14. As described above, the temperature adjustment apparatus 50 according to the present embodiment blows a temperature-adjusted gas to at least one of the optical paths (region around the optical systems) in the optical systems (off-axis scope 30, laser interferometers 110 and 210, projection optical system 15, and illumination optical system 12). In the present embodiment, the arrangement examples of the temperature adjustment apparatus 50 are not limited to the examples in FIGS. 3A, 3B, 3C, and 3D, and the number of the temperature adjustment apparatuses 50 and positions thereof are not limited thereto. It is only required to arrange the temperature adjustment apparatus 50 to blow the gas to at least one of the optical paths in the optical systems of the off-axis scope 30, the laser interferometers 110 and 210, the projection optical system 15, and the illumination optical system 12. Alternatively, the temperature adjustment apparatus 50 may be arranged in each of the optical paths in the optical systems. Further, in the example in FIG. 3B, the two temperature adjustment apparatuses 50 are arranged to blow gases respectively to the optical paths of the laser interferometer 110 and the laser interferometer 210, but the temperature adjustment apparatus 50 may be provided only for the optical path with a large temperature change. Further, in the example in FIG. 3D, the temperature adjustment apparatus 50 configured to blow temperature-adjusted gases to the upper side region (+Z side region) of the reticle 13 and the lower side region (−Z side region) of the reticle stage 14 is described, but the temperature adjustment apparatus 50 may blow the gas only to one of the regions. Further, in the example in FIG. 3D, the example in which the two blowing units 52 are provided, the pipe 60 is branched, and the one temperature adjustment unit 61 and the one second control unit 62 are provided is described, but two temperature adjustment units 61 and two second control units 62 may be provided, without branching the pipe 60.

Figure 4:
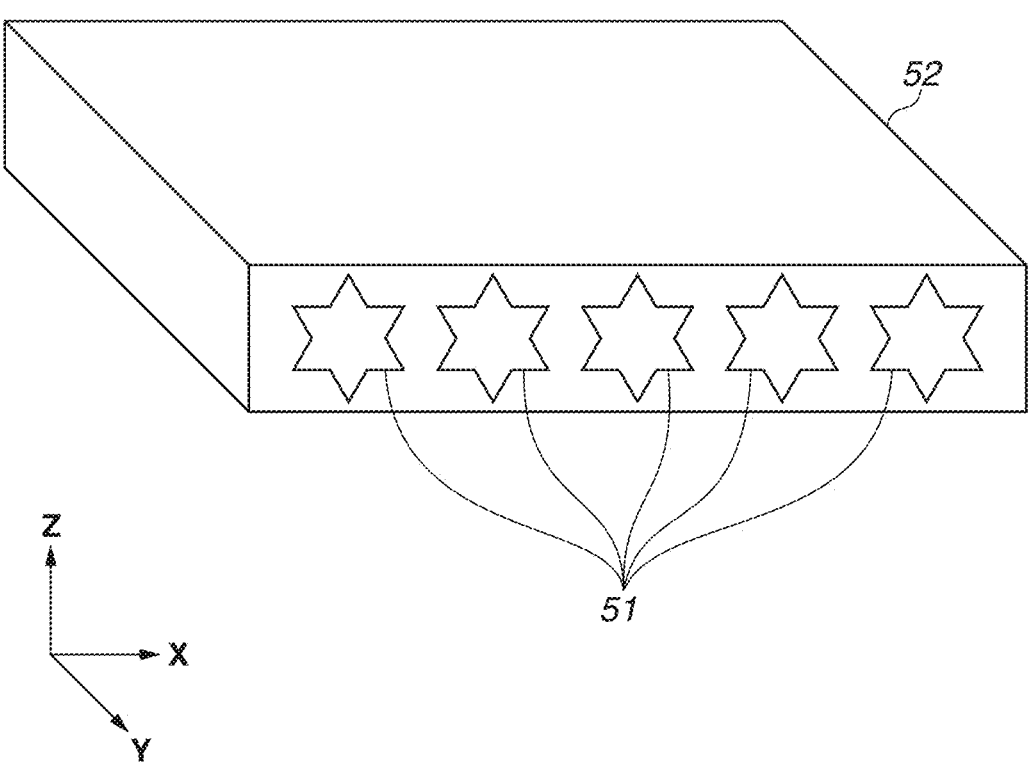
FIG. 4 is a diagram illustrating a configuration of a blowing unit according to the first embodiment.

FIG. 4 is a diagram illustrating a configuration of the blowing unit 52 according to the present embodiment. In FIG. 4, not all the cross-section shapes of the flow paths through which the gas flows in the blowing unit 52 need to be made to be the shapes of the opening portions 51, and the cross-section shapes of the flow paths (flow paths on the pipe 60 side) other than the portions of the flow paths near the opening portions 51 may be circles or quadrangles. Further, in the example in FIG. 4, a plurality of the opening portions 51 having one type of shape is provided, but the opening portions with different shapes (plurality of types of shapes) with each other may be provided.

Figure 5A:
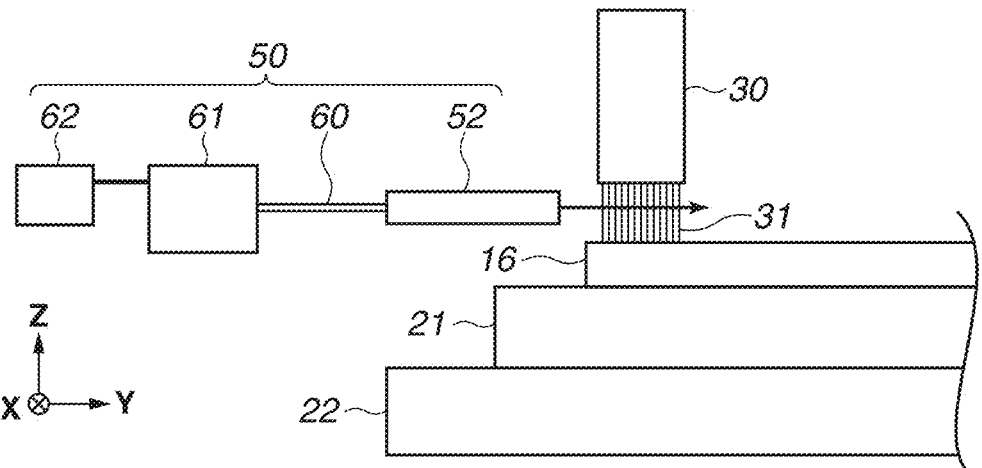
FIGS. 5A and 5B are diagrams illustrating a relationship between a maximum width of an optical path and a width in which a plurality of opening portions is provided, according to the first embodiment.
Figure 5B:
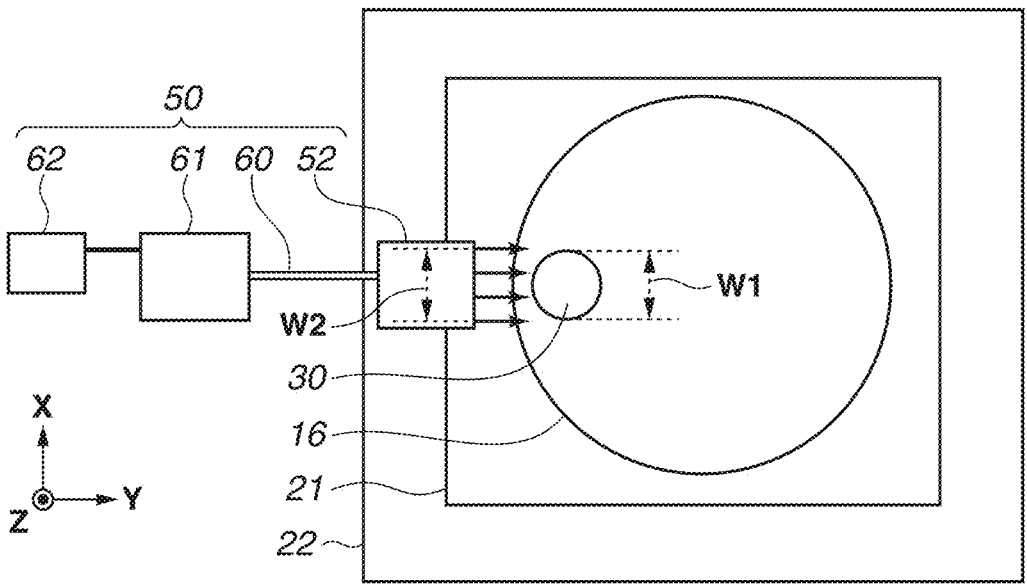

Further, it is desirable that a plurality of the opening portions 51 is provided to adjust the temperature in the optical path region. Further, it is desirable that a width in which the plurality of opening portions 51 is provided is larger than a maximum width of the optical path in the direction orthogonal to the gas blowing direction in the XY plane (i.e., plane orthogonal to the optical path of the optical system). FIGS. 5A and 5B are diagrams illustrating a relationship between the maximum width of the optical path according to the present embodiment, and the width in which the plurality of opening portions 51 is provided. FIG. 5A is a schematic diagram illustrating a state viewed from the +X direction side, in a case where the temperature adjustment apparatus 50 blows gas to an optical path 31 of the off-axis scope 30. As illustrated in FIG. 5A, the optical path of the off-axis scope 30 passes through a whole lower side region (−Z direction side region) of the off-axis scope 30. FIG. 5B is a schematic diagram illustrating a state viewed from the +Z direction side, in the case where the temperature adjustment apparatus 50 blows the gas to the optical path 31 of the off-axis scope 30. The maximum width of the optical path 31 in a direction (X direction) orthogonal to a gas blowing direction (Y direction) in a plane (XY plane) orthogonal to the optical path 31 of the optical system (off-axis scope 30) is a width W1. In addition, the width in which the plurality of the opening portions 51 is provided in the temperature adjustment apparatus 50 is a width W2. In this case, the width W2 in which the plurality of opening portions 51 is provided is larger than the maximum width W1 of the optical path 31 in the direction orthogonal to the gas blowing direction in the plane orthogonal to the optical path 31. In this way, it is possible to adjust the temperature of the whole optical path when the blowing unit 52 blows the gas via the opening portions 51. In the present embodiment, an example in which the temperature adjustment apparatus 50 is arranged so that the plurality of opening portions 51 is lined up along the X axis, or along the Y axis, is described, but the temperature adjustment apparatus 50 may be arranged so that the plurality of opening portions 51 is lined up along the Z axis.

The complicated shapes of the opening portions 51 of the temperature adjustment apparatus 50 can be formed using, for example, a three-dimensional (3D) printer. Alternatively, the complicated shapes of the opening portions 51 can be formed by combining two or more components after performing a cutting operation on each component. Alternatively, the temperature adjustment apparatus 50 can be manufactured using means such as wire cutting, laser processing, and welding. Further, in a case where the temperature adjustment apparatus 50 is manufactured using the 3D printer, concavities and convexities may be caused in the flow path through which the gas of the temperature adjustment apparatus 50 flows, and inside the substrate processing apparatus 1 may be contaminated with particles, due to the concavities and convexities being peeled and blown together with the gas. For this reason, in the case where the temperature adjustment apparatus 50 is manufactured using the 3D printer, it is desirable to perform polishing processing or plating processing on the inner wall surface of the flow path through which the gas flows in the temperature adjustment apparatus 50.

Figures 6A, 6B, 6C:
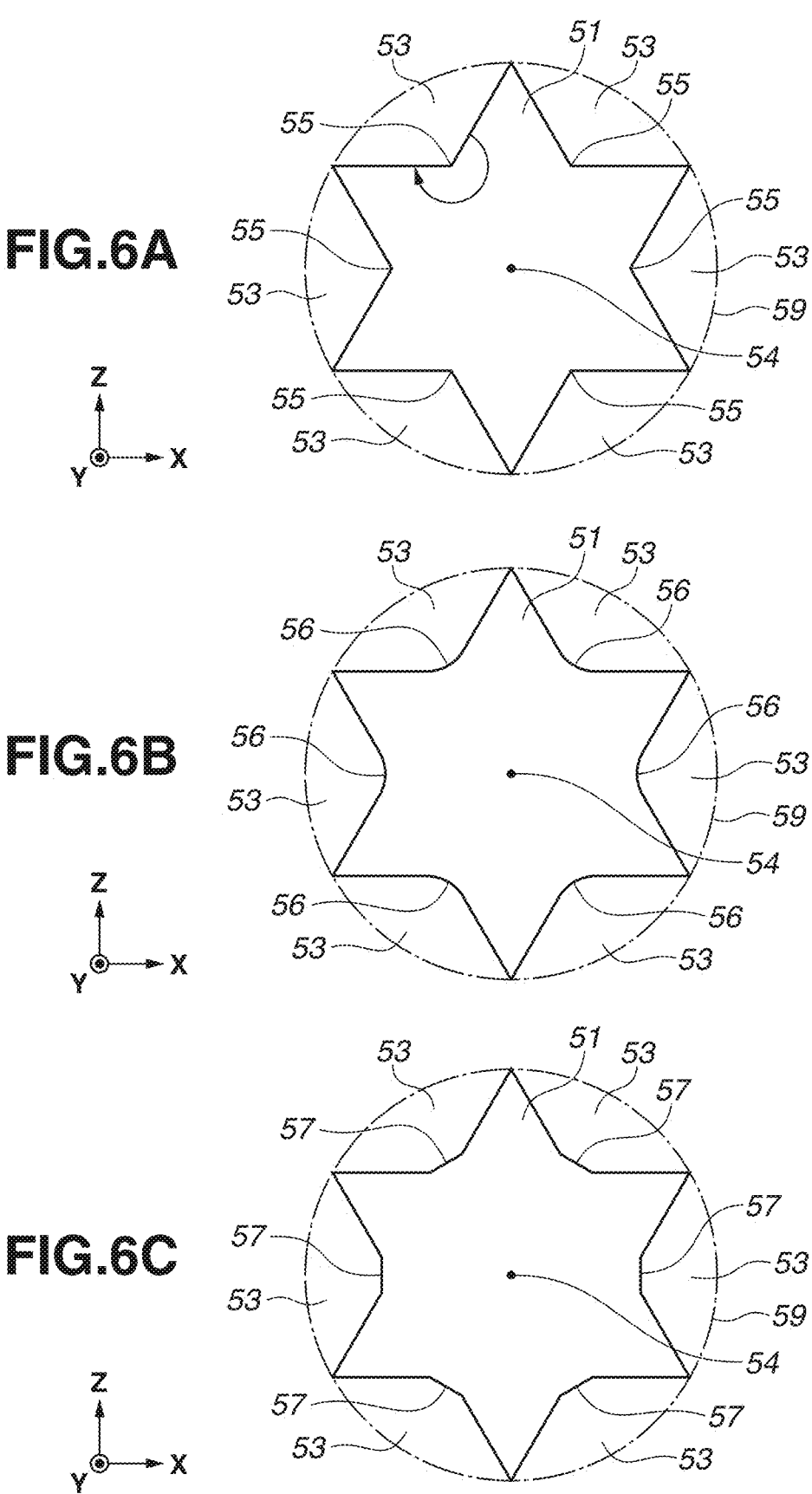
FIGS. 6A, 6B, and 6C are diagrams each illustrating an example of an opening portion according to the first embodiment.

FIGS. 6A, 6B, and 6C each illustrate an example of the opening portion 51 according to the present embodiment. The outer periphery of each of the opening portions 51 of the temperature adjustment apparatus 50 according to the present embodiment has depressed portions 53, which are depressed inward from the outer periphery of a circumscribed circle 59 of each of the opening portions 51. Further, each of the depressed portions 53 has an intersection point 55 (FIG. 6A), a curved line portion 56 (FIG. 6B), or a straight line portion 57 (FIG. 6C), at a position nearest to a center 54, which is a center of the circumscribed circle 59. In this case, the center 54 is also a center of each of the opening portions 51.

FIG. 6A is an example of having the intersection points 55 at positions nearest to the center 54 of the circumscribed circle 59. FIG. 6B is an example of having the curved line portions 56 at positions nearest to the center 54 of the circumscribed circle 59. FIG. 6C is an example of having the straight line portions 57 at positions nearest to the center 54 of the circumscribed circle 59.

In the case where the intersection points 55 are provided at the positions nearest to the center 54 as illustrated in FIG. 6A, each of the intersection points 55 is any one of an intersection point of two straight line portions, an intersection point of two curved line portions, and an intersection point of a straight line portion and a curved line portion. The angle at each of the intersection points 55 inside the opening portion 51 is larger than 180 degrees.

In the case where the curved line portions 56 are provided at the positions nearest to the center 54 as illustrated in FIG. 6B, the diameter of each of the curved line portions 56 is two thirds or less of the diameter of the circumscribed circle 59. In this case, it is more desirable that the diameter of each of the curved line portions 56 is half or less (further desirably one third or less) of the diameter of the circumscribed circle 59.

In the case where the straight line portions 57 are provided at the positions nearest to the center 54 as illustrated in FIG. 6C, the length of each of the straight line portions 57 is one fifth or less of the diameter of the circumscribed circle 59. In this case, it is more desirable that the length of each of the straight line portions 57 is one tenth or less (more desirably one twentieth) of the diameter of the circumscribed circle 59.

The opening portions 51 according to the present embodiment have the characteristics described above, and by blowing the gas via the opening portions 51 having such characteristics, the gas blown around the positions of the intersection points 55, the curved line portions 56, or the straight line portions 57 becomes a turbulent flows. Further, the gas blown at the positions nearer to the center 54 than the positions of the intersection points 55, the curved line portions 56, or the straight line portions 57, in the opening portion 51, becomes a laminar flow with a high speed and a small variation in the flow speed.

FIGS. 7A and 7B each illustrate a simulation result of a gas flow speed (velocity) at an opening portion when gas is blown. In an upper figure in each of FIGS. 7A and 7B, a portion with a darker color indicates that the gas flow speed is fast, and a portion with a lighter color indicates that the gas flow speed is slow. In the simulation illustrated in each of FIGS. 7A and 7B, the condition of a flow rate source is set to 10 L/min, and the figure is color-coded into three stages corresponding to the gas flow speeds at the opening portion. In a case where the gas flow speed is fast (3 m/s or more), the color is darkest, in a case where the gas flow speed is moderate (1.5 m/s or more and 3.0 m/s or less), the color is second darkest, and in a case where the gas flow speed is slow (less than 1.5 m/s), the color is third darkest (lightest). The lower figure in each of FIGS. 7A and 7B illustrates a relationship between each position on a dotted line in the upper figure and the corresponding gas flow speed.

FIG. 7A illustrates a simulation result of the gas flow speed at the opening portion 51 according to the present embodiment. FIG. 7B illustrates a simulation result of the gas flow speed at a circular opening portion with no depressed portions. The area of the region with a high gas flow speed (3 m/s or more) in FIG. 7A is larger than that with the high gas flow speed (3 m/s or more) in FIG. 7B. In other words, the area of the region with the fast gas flow speed in the opening portion 51 according to the present embodiment is larger than the area of the region with the fast gas flow speed in the circular opening portion. This is because the turbulent flows are generated at the positions of the intersection points 55, the curved line portions 56, or the straight line portions 57 in the opening portion 51 according to the present embodiment, and a fast laminar flow flows at a position (near the central portion) surrounded by the turbulent flows.

The blown gas loses the speed due to a frictional force (shear force) at the outer periphery (wall surface) of the opening portion. In the case of the circular opening portion in FIG. 7B, since the laminar flow is generated all over the opening portion, and the gas speed significantly reduces at the outer periphery (wall surface) of the opening portion, the area of the region with the fast gas flow is small. Thus, the variation in the gas flow speed is large near the central portion of the opening portion 51.

The opening portions 51 according to the present embodiment cause the intersection points 55, the curved line portions 56, or the straight line portions 57 to generate turbulent flows, and the fast laminar flow flows at the position surrounded by the turbulent flows, so that the loss of the laminar flow speed near the central portion can be reduced. As a result, the area of the region with the high gas flow speed (3 m/s or more) becomes larger near the central portion, so that the variation in the gas flow speed near the central portion of the opening portion 51 can be reduced. By increasing the region with the high gas flow speed to reduce the variation in the blown gas flow speed, the diffusion (spread) of the gas blown from the blowing unit 52 via the opening portions 51 can be reduced.

FIGS. 8A and 8B each illustrate a gas flow blown from the blowing unit 52 via the opening portions. FIG. 8A illustrates a gas flow when the gas is blown from the blowing unit 52 via the opening portions 51 according to the present embodiment. FIG. 8B illustrates a gas flow when the gas is blown from the blowing unit 52 via the circular opening portions. FIG. 8A illustrating a result of blowing the gas via the opening portions 51 according to the present embodiment indicates that the diffusion (spread) of the gas is reduced, compared with FIG. 8B illustrating a result of blowing the gas via the circular opening portions. Further, in the case where the gas is blow via the opening portions 51 according to the present embodiment, it is possible not only to reduce the diffusion of the gas, but also to enhance the directional characteristics (rectilinear advance property). In addition, in the gas flow simulation, the case where the gas is blown from the opening portions 51 according to the present embodiment can reduce the diffusion of the gas by approximately 23% at a position away from the opening portion 51 by 17 mm, compared with the case where the gas is blown from the circular opening portions.

Figure 9A:
FIGS. 9A to 9R are diagrams each illustrating an example of the opening portion according to the first embodiment.
Figure 9B:
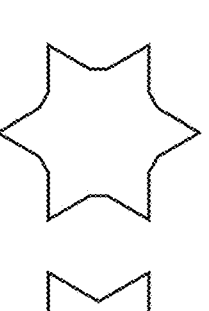
Figure 9C:
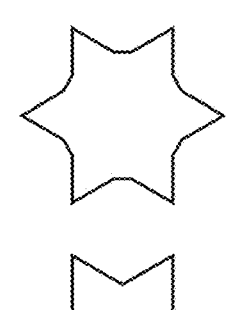
Figure 9D:
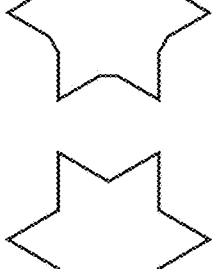
Figure 9E:
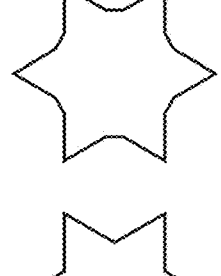
Figure 9F:
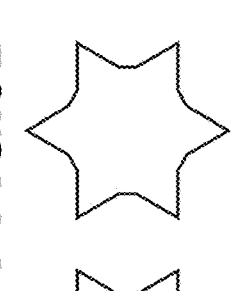
Figure 9G:
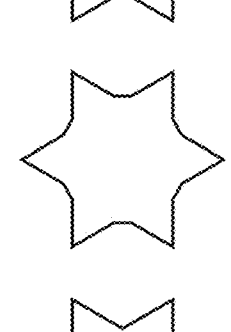
Figure 9H:
Figure 9I:
Figure 9J:
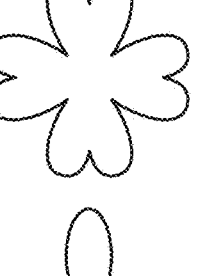
Figure 9K:
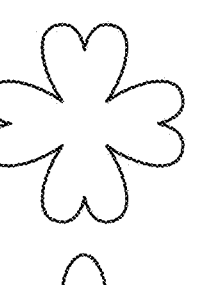
Figure 9L:
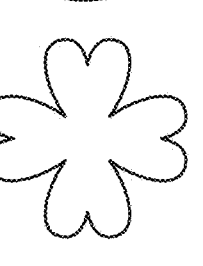
Figure 9M:
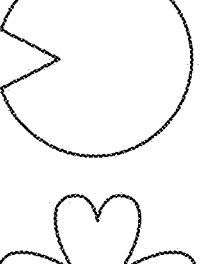
Figure 9N:
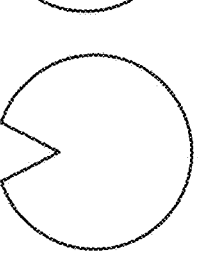
Figure 9O:
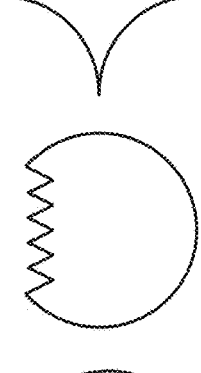
Figure 9P:
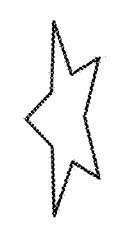
Figure 9Q:
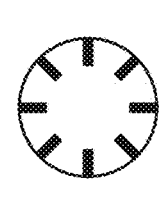
Figure 9R:
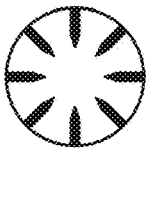

FIGS. 9A to 9R are diagrams each illustrating an example of the opening portion 51 according to the present embodiment. However, the opening portion 51 according to the present embodiment is not limited to the examples in FIGS. 9A to 9R, and the shape of the outer periphery of the opening portion 51 is only required to satisfy the following characteristics. The outer periphery shape of the opening portion 51 has the depressed portions 53 depressed inward from the outer periphery of the circumscribed circle 59 of the opening portion 51. Further, each of the depressed portions 53 has the intersection point 55, the curved line portion 56, or the straight line portion 57, at the position nearest to the center 54 of the circumscribed circle 59. In the case where the intersection points 55 are provided at the positions nearest to the center 54, each of the intersection points 55 is any one of an intersection point of two straight line portions, an intersection point of two curved line portions, and an intersection point of a straight line portion and a curved line portion. Then, the angle inside the opening portion 51 at each of the intersection points 55 is only required to be 180 degrees or more. In the case where the curved line portions 56 are provided at the positions nearest to the center 54 of the circumscribed circle 59, the diameter of each of the curved line portions 56 is only required to be two thirds or less of the diameter of the circumscribed circle 59. In this case, it is more desirable that the diameter of each of the curved line portions 56 is half or less (further desirably one third or less) of the diameter of the circumscribed circle 59. In the case where the straight line portions 57 are provided at the positions nearest to the center 54 of the circumscribed circle 59, the length of each of the straight line portions 57 is one fifth or less of the diameter of the circumscribed circle 59. In this case, it is more desirable that the length of each of the straight line portions 57 is one tenth or less (more desirably one twentieth or less) of the diameter of the circumscribed circle 59. Further, each of the depressed portions 53 according to the present embodiment may have a shape, for example, with partition plates being inserted in a circular opening, as illustrated in FIGS. 9Q and 9R.

Figure 10A:
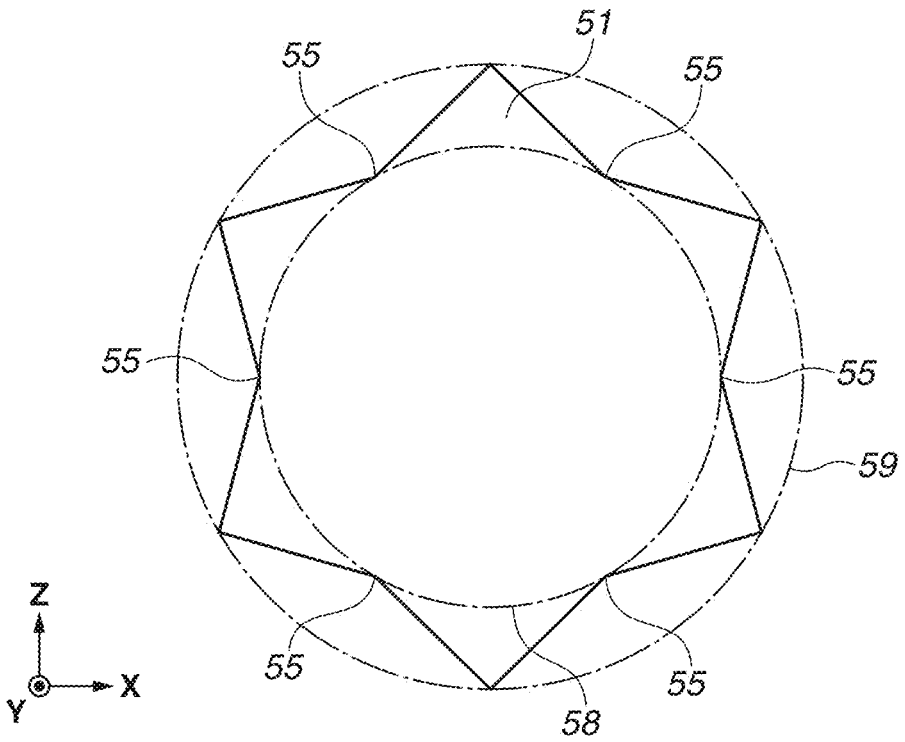
FIGS. 10A and 10B are diagrams each illustrating a relationship between sizes of an inscribed circle and a circumscribed circle of the opening portion according to the first embodiment.
Figure 10B:
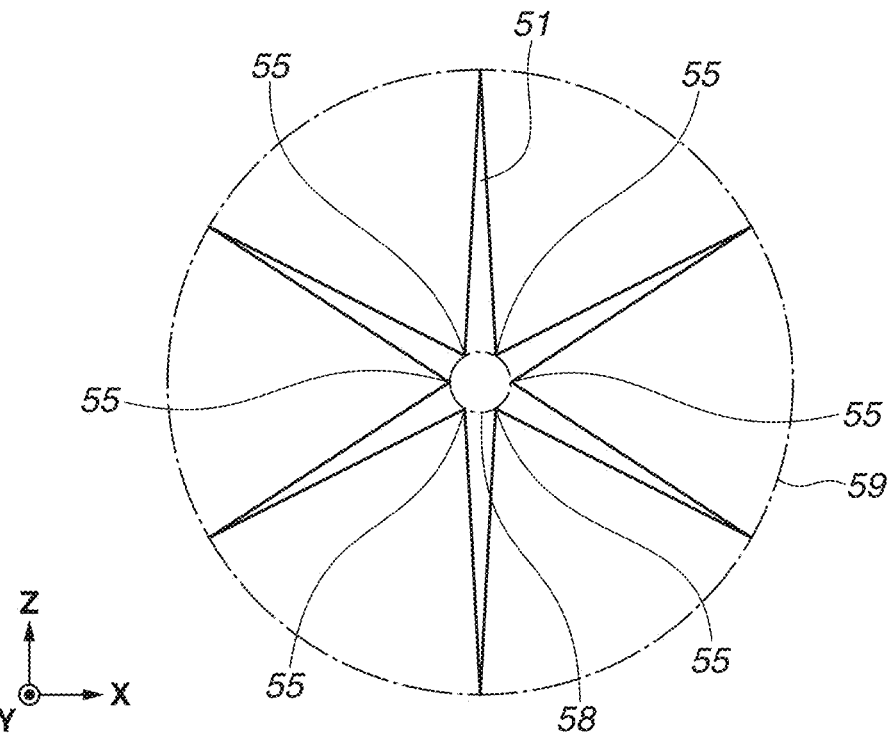

FIGS. 10A and 10B are diagrams each illustrating a relationship between sizes of an inscribed circle 58 and the circumscribed circle 59 of the opening portion 51 according to the present embodiment. In the opening portion 51 according to the present embodiment, the relationship in size between the diameter of the inscribed circle 58 of the opening portion 51 contacting the plurality of intersection points 55, the plurality of curved line portions 56, or the plurality of straight line portions 57 of the opening portion 51, and the diameter of the circumscribed circle 59 relates to the temperature adjustment performance of the temperature adjustment apparatus 50. For example, in a case where the diameter of the inscribed circle 58 is larger than two thirds of the diameter of the circumscribed circle 59 as illustrated in FIG. 10A, the laminar flow near the central portion cannot be surrounded by the turbulent flows generated at the intersection points 55, the curved line portions 56, or the straight line portions 57. Thus, the effect of reducing the variation in the gas flow speed near the central portion of the opening portion 51 and the effect of reducing the diffusion of the blown gas are reduced. Thus, it is desirable that the diameter of the inscribed circle 58 of the opening portion 51 contacting the intersection points 55, the curved line portions 56, or the straight line portions 57 is two thirds or less of the diameter of the circumscribed circle 59. In this case, it is more desirable that the diameter of the inscribed circle 58 of the opening portion 51 is three fifths or less (more desirably half or less) of the diameter of the circumscribed circle 59.

Further, in the case where the diameter of the inscribed circle 58 is less than one tenth of the diameter of the circumscribed circle 59 as illustrated in FIG. 10B, the region near the central portion through which the laminar flow flows surrounded by the turbulent flows generated at the intersection points 55, the curved line portions 56, or the straight line portions 57 becomes small, so that the effect of reducing the temperature variation in the optical path is reduced. Thus, it is desirable that the diameter of the inscribed circle 58 of the opening portion 51 contacting the intersection points 55, the curved line portions 56, or the straight line portions 57 is one tenth or more (more desirably one fourth or more) of the circumscribed circle 59.

Next, timings to blow the gas from the blowing unit 52 of the temperature adjustment apparatus 50 via the opening portions 51 according to the present embodiment will be described. For example, in a case where the gas blown from the blowing unit 52 spreads, the optical element changes locally in temperature due to the gas blown to the optical element. When the blowing of the gas is stopped, the locally changed temperature of the portion returns, and the optical performance may differ between when the gas is blown and when the gas is not blown.

In the case where the gas blown from the blowing unit 52 spreads, it is required to constantly blow the gas even when the substrate is exchanged to reduce the change in the optical performance. However, the temperature adjustment apparatus 50 according to the present embodiment can reduce the spread of the gas, not leading to the local temperature change of the optical element, so that change in the optical performance is small between when the gas is blown and when the gas is not blown, even when the gas blowing is stopped. Accordingly, the gas may be blown only when the optical system of the optical path to which the gas is blown is used, while blowing of the gas is stopped when the substrate is changed or a maintenance is performed.

Further, the flow rate and the temperature of the gas blown from the blowing unit 52 may be adjusted. For example, in a case where a temperature sensor is attached to an optical element to cause the optical element (e.g., objective lens) corresponding to a path to which the gas is blown to become a target temperature, the second control unit 62 may adjust the flow rate and the temperature of the gas blown from the blowing unit 52, based on a value output from the temperature sensor. In this case, the temperature sensor may be arranged at a position at which the temperature sensor can measure the temperature in the optical path, not to measure the temperature of the optical element. Alternatively, even in a case where the temperature sensor is not provided, the second control unit 62 may estimate the temperature change from the substrate processing conditions or the like, and adjust the flow rate and the temperature of the gas blown from the blowing unit 52, based on the estimated result. In this case, adjusting the temperature by the second control unit 62 is equal to controlling the temperature adjustment unit 61 to cause the optical element to become a desired temperature. Further, in the case where the plurality of opening portions 51 is provided, the second control unit 62 may select some opening portions 51 to be used from all the opening portions 51, and may control the gas to be supplied via the selected opening portions 51.

Figure 11:
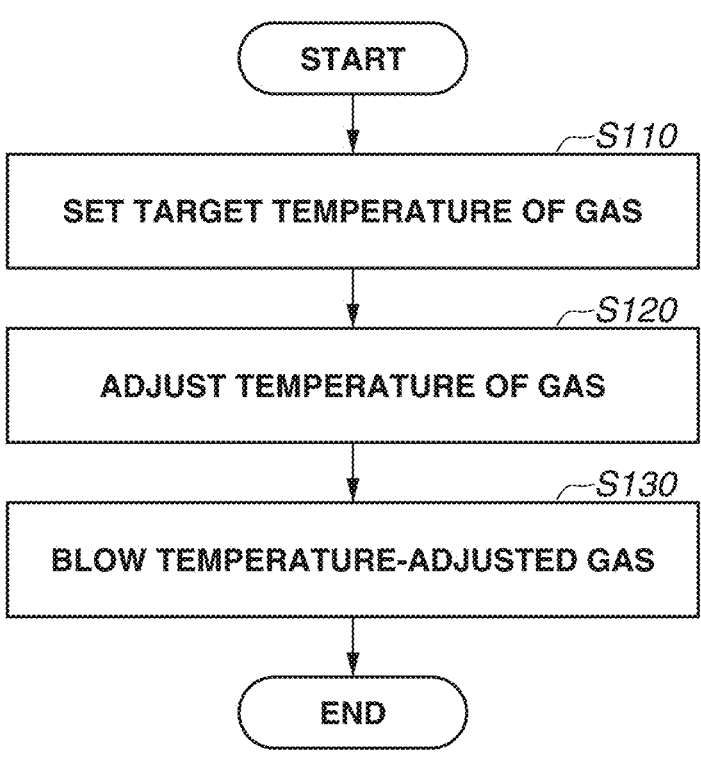
FIG. 11 is a flowchart illustrating a temperature adjustment method according to the first embodiment.

FIG. 11 is a flowchart illustrating a temperature adjustment method according to the present embodiment. First, in step S110, the second control unit 62 sets a target temperature of the gas to be blown (target setting step). Next, in step S120, the second control unit 62 controls the temperature adjustment unit 61 to adjust the temperature of the gas, so as to be the target temperature set in step S110 (temperature adjustment step). Next, in step S130, the second control unit

62 blows the gas temperature-adjusted in step S120 to the optical path of the optical system via the opening portions 51 (blowing step). In this way, the temperature adjustment is performed in the present embodiment. In addition, the outer periphery shape of each of the opening portions 51 of the temperature adjustment apparatus 50 used in the blowing step has the characteristics as described above.

As described above, since the temperature change in the optical path is reduced by the temperature adjustment apparatus 50 according to the present embodiment, the temperature-adjusted gas blown from the blowing unit 52 via the opening portions 51 is reduced in diffusion (spread). In this way, it is possible to reduce the gas blown from the blowing unit 52 via the opening portions 51 to be blown to the optical element of the optical system, and reduce the temperature change in the optical path while reducing the deterioration of the optical performance due to the local temperature change of the optical element. Further, it is also possible to reduce the deterioration of the optical performance or the measurement accuracy caused by blowing the gas blown via the opening portions 51 to the optical element or the substrate 16 vibrating the object (optical element or substrate 16) thereby. Further, by blowing the temperature-adjusted gas to the path of the optical system, it is possible to suppress the deformation of the object (substrate 16, reticle 13, or optical element) that is located around the optical path and that may deform due to the temperature change. In addition, in the present embodiment, the example in which the gas blown from the temperature adjustment apparatus 50 is temperature-adjusted is described, but not only the temperature-adjusted but also the humidity-adjusted gas may be blown.

A second embodiment is characterized in that articles are manufactured using the above-described temperature adjustment apparatus 50.

Figure 12:
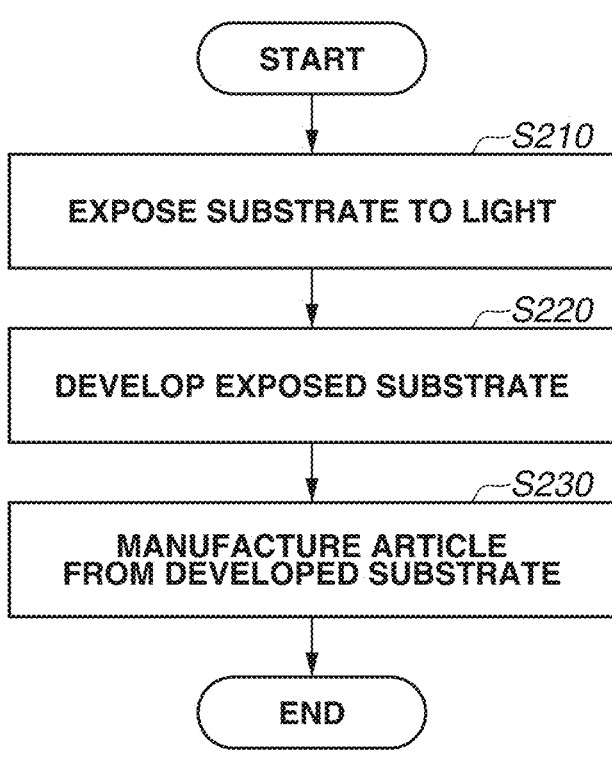
FIG. 12 is a flowchart illustrating an article manufacturing method according to a second embodiment.

FIG. 12 is a flowchart illustrating an article manufacturing method according to the present embodiment. First, in step S210, the substrate 16 is exposed to light using a lithography apparatus in an exposure step. In step S220, the substrate 16 exposed in the exposure step is developed in a developing step. Then, in step S230, a manufacturing step to manufacture an article from the substrate 16 developed in the developing step is performed. In the present embodiment, the lithography apparatus used in the exposure step includes the illumination optical system 12 configured to illuminate the reticle (original) 13 with light from the light source and the projection optical system 15 configured to project the light from the reticle (original) 13 onto the substrate 16. The lithography apparatus further includes the measurement optical system configured to measure the position of the stage 20 configured to hold the substrate 16 or the position of the substrate 16. Further, the lithography apparatus includes the temperature adjustment apparatus 50 including the blowing unit 52 configured to blow a temperature-adjusted gas to at least one of the optical paths of the illumination optical system 12, the projection optical system 15, and the measurement optical system, via the opening portions 51. The opening portions 51 are holes provided in the blowing unit 52.

The shape of the outer periphery of each of the opening portions 51 has the depressed portions 53 depressed inward from the circumscribed circle 59 of each of the opening portions 51. In each of the depressed portions 53, in a case where the position nearest to the center 54 of the circumscribed circle 59 is the intersection point of the two straight line portions, the intersection point of the two curved line portions, or the intersection point of the straight line portion and the curved line portion, the angle inside the opening portion 51 at the intersection point is 180 degrees or more. In each of the depressed portions 53, in a case where the position nearest to the center of the circumscribed circle 59 is a curved line portion, the diameter of the curved portion is two thirds or less of the circumscribed circle 59. In each of the depressed portions 53, in a case where the position nearest to the center of the circumscribed circle 59 is a straight line portion, the length of the strait line portion is one fifth or less of the diameter of the circumscribed circle 59.

Examples of the articles manufactured by this manufacturing method include, for example, semiconductor integrated circuit (IC) elements, liquid crystal display elements, color filters, and microelectromechanical system (MEMS) elements.

The manufacturing process includes, for example, an etching step and a resist removing step performed on the developed substrate, a dicing step, a bonding step, and a packaging step. With this manufacturing method, it is possible to manufacture articles with a quality higher than the conventional articles.

The present invention is not limited to the above-described embodiments, and can be modified and changed without departing from the spirit and range of the present invention. Thus, claims are attached to make the range of the present invention apparent.

According to the present invention, it is possible to provide a temperature adjustment apparatus capable of adjusting the temperature of an optical path while reducing a local temperature change of an optical element in an optical system.

While the present invention has been described with reference to embodiments, it is to be understood that the invention is not limited to the disclosed embodiments. The scope of the following claims is to be accorded the broadest interpretation so as to encompass all such modifications and equivalent structures and functions.

This application claims the benefit of Japanese Patent Application No. 2023-067180, filed Apr. 17, 2023, which is hereby incorporated by reference herein in its entirety.

What is claimed is:

1. A temperature adjustment apparatus comprising:

a blowing unit configured to blow a temperature-adjusted gas to an optical path of an optical system via an opening portion, wherein a shape of an outer periphery of the opening portion includes a depressed portion depressed inward from a circumscribed circle of the opening portion, the opening portion satisfies at least one of the following conditions (i), (ii), or (iii):

(i) when a position nearest to a center of the circumscribed circle in the depressed portion is any of an intersection point of two straight line portions, an intersection point of two curved line portions, and an intersection point of a straight line portion and a curved line portion, an angle at the intersection point inside the opening portion is 180 degrees or more, (ii) when the position nearest to the center of the circumscribed circle in the depressed portion is a curved line portion, a diameter of the curved line portion is two thirds or less of a diameter of the circumscribed circle, and (iii) when the position nearest to the center of the circumscribed circle in the depressed portion is a straight line portion, a length of the straight line portion is one fifth or less of the diameter of the circumscribed circle, and wherein in a case where the blowing unit blows temperature-adjusted gas through the opening portion, the shape of the outer periphery of the opening portion produces laminar flow of the temperature-adjusted gas at the center of the opening portion.

2. The temperature adjustment apparatus according to claim 1, wherein the shape of the outer periphery of the opening portion includes a plurality of the depressed portions, and wherein a diameter of an inscribed circle of the opening portion contacting the intersection point, the curved line portion, or the straight line portion in each of the plurality of depressed portions nearest to the center of the circumscribed circle is two thirds or less of the diameter of the circumscribed circle.

3. The temperature adjustment apparatus according to claim 1, wherein the shape of the outer periphery of the opening portion includes a plurality of the depressed portions, and wherein a diameter of an inscribed circle of the opening portion contacting the intersection point, the curved line portion, or the straight line portion nearest to the center of the circumscribed circle in each of the plurality of depressed portions is one tenth or more of the diameter of the circumscribed circle.

4. The temperature adjustment apparatus according to claim 1, wherein the shape of the outer periphery of the opening portion includes at least three of the depressed portions.

5. The temperature adjustment apparatus according to claim 1, wherein the optical system is at least any one of an illumination optical system configured to illuminate an original, a projection optical system configured to project light from the original to a substrate, and a measurement optical system configured to measure a position of a stage configured to hold the substrate or a position of the substrate.

6. The temperature adjustment apparatus according to claim 1, wherein the blowing unit blows the gas to the optical path via a plurality of the opening portions.

7. The temperature adjustment apparatus according to claim 6, wherein the plurality of opening portions includes opening portions different in shape from each other.

8. The temperature adjustment apparatus according to claim 1, wherein a width in which a plurality of the opening portions is provided is larger than a maximum width of the optical path in a direction orthogonal to a direction in which the gas is blown, in a plane orthogonal to the optical path.

9. The temperature adjustment apparatus according to claim 1, further comprising:

a temperature adjustment unit configured to adjust a temperature of the gas blown by the blowing unit; and a control unit configured to control the temperature adjustment unit based on a measurement result of a temperature in the optical path of the optical system or a temperature of an optical element in the optical system.

10. The temperature adjustment apparatus according to claim 1, further comprising a control unit configured to control and adjust a flow rate of the blown gas, based on a measurement result of a temperature in the optical path of the optical system or a temperature of an optical element in the optical system.

11. The temperature adjustment apparatus according to claim 1, further comprising:

a temperature adjustment unit configured to adjust a temperature of the gas blown by the blowing unit, and a control unit configured to control the temperature adjustment unit based on an estimated result of a temperature change in the optical path of the optical system.

12. The temperature adjustment apparatus according to claim 1, further comprising a control unit configured to control and adjust a flow rate of the gas, based on an estimated result of a temperature change in the optical path of the optical system.

13. The temperature adjustment apparatus according to claim 1, further comprising a control unit configured to select an opening portion to be used from among a plurality of the opening portions.

14. A lithography apparatus comprising:

an illumination optical system configured to illuminate an original with light from a light source;

a projection optical system configured to project light from the original to a substrate;

a measurement optical system configured to measure a position of a stage configured to hold the substrate or a position of the substrate;

a temperature adjustment apparatus including a blowing unit configured to blow a temperature-adjusted gas via an opening portion to a peripheral region of at least one of the illumination optical system, the projection optical system, and the measurement optical system, wherein a shape of an outer periphery of the opening portion includes a depressed portion depressed inward from a circumscribed circle of the opening portion, the opening portion satisfies at least one of the following conditions (i), (ii), or (iii):

(i) when a position nearest to a center of the circumscribed circle in the depressed portion is any of an intersection point of two straight line portions, an intersection point of two curved line portions, and an intersection point of a straight line portion and a curved line portion, an angle at the intersection point inside the opening portion is 180 degrees or more, (ii) when the position nearest to the center of the circumscribed circle in the depressed portion is a curved line portion, a diameter of the curved line portion is two thirds or less of a diameter of the circumscribed circle, and (iii) when the position nearest to the center of the circumscribed circle in the depressed portion is a straight line portion, a length of the straight line portion is one fifth or less of the diameter of the circumscribed circle, and wherein in a case where the blowing unit blows temperature-adjusted gas through the opening portion, the shape of the outer periphery of the opening portion produces laminar flow of the temperature-adjusted gas at the center of the opening portion.

15. An article manufacturing method comprising:

exposing a substrate to light using a lithography apparatus;

developing the exposed substrate; and manufacturing an article from the developed substrate, wherein the lithography apparatus includes an illumination optical system configured to illuminate an original with light from a light source, a projection optical system configured to project light from the original to a substrate, a measurement optical system configured to measure a position of a stage configured to hold the substrate or a position of the substrate, and a temperature adjustment apparatus including a blowing unit configured to blow a temperature-adjusted gas via an opening portion to a peripheral region of at least one of the illumination optical system, the projection optical system, and the measurement optical system, wherein a shape of an outer periphery of the opening portion includes a depressed portion depressed inward from a circumscribed circle of the opening portion, the opening portion satisfies at least one of the following conditions (i), (ii), or (iii):

(i) when a position nearest to a center of the circumscribed circle in the depressed portion is any of an intersection point of two straight line portions, an intersection point of two curved line portions, and an intersection point of a straight line portion and a curved line portion, an angle at the intersection point inside the opening portion is 180 degrees or more, (ii) when the position nearest to the center of the circumscribed circle in the depressed portion is a curved line portion, a diameter of the curved line portion is two thirds or less of a diameter of the circumscribed circle, and (iii) when the position nearest to the center of the circumscribed circle in the depressed portion is a straight line portion, a length of the straight line portion is one fifth or less of the diameter of the circumscribed circle, and wherein in a case where the blowing unit blows temperature-adjusted gas through the opening portion, the shape of the outer periphery of the opening portion produces laminar flow of the temperature-adjusted gas at the center of the opening portion.

* * * * *